(12) United States Patent
Manno et al.

(10) Patent No.: US 6,603,658 B2
(45) Date of Patent: Aug. 5, 2003

(54) LAMINAR AIR JET COOLING OF HEAT PRODUCING COMPONENTS

(75) Inventors: Vincent P. Manno, Sudbury, MA (US); John R. Guarino, Raynham, MA (US)

(73) Assignee: Tufts University, Boston, MA (US)

( * ) Notice: Subject to any disclaimer, the term of this patent is extended or adjusted under 35 U.S.C. 154(b) by 0 days.

(21) Appl. No.: 09/811,863

(22) Filed: Mar. 19, 2001

(65) Prior Publication Data

US 2002/0145851 A1 Oct. 10, 2002

(51) Int. Cl.[7] .................................................. H05K 7/20
(52) U.S. Cl. ........................ 361/687; 361/699; 165/908; 454/184
(58) Field of Search .......................... 361/687, 699–700, 361/681, 683–686; 165/908, 104.33, 80.4; 454/184; 204/164

(56) References Cited

U.S. PATENT DOCUMENTS

| | | | | |
|---|---|---|---|---|
| 5,566,377 A | * | 10/1996 | Lee | 361/695 |
| 5,901,037 A | * | 5/1999 | Hamilton et al. | 361/699 |
| 6,148,907 A | * | 11/2000 | Cheng | 361/695 |
| 6,154,368 A | * | 11/2000 | Scofield | 361/719 |
| 6,219,236 B1 | * | 4/2001 | Hirano et al. | 361/695 |
| 6,259,600 B1 | * | 7/2001 | Talbot et al. | 361/687 |
| 6,333,847 B1 | * | 12/2001 | Katsui et al. | 361/679 |
| 6,341,062 B1 | * | 1/2002 | Patel | 361/687 |

* cited by examiner

*Primary Examiner*—Darren Schuberg
*Assistant Examiner*—Hung Van Duong
(74) *Attorney, Agent, or Firm*—Fish & Richardson P.C.

(57) ABSTRACT

A low velocity, laminar jet of air is directly impinged on the surface of heat producing components such as a microprocessor chip. A laminar jet air flow has a very low mass flow rate and has a high convection heat transfer rate at the stagnation region of the flow. A fan or an actuator coupled to a tube can be used to provide laminar jet air on the heat producing component. For any apparatus that places a premium on conserving power, delivery of a low velocity, laminar jet provides an effective way to cool the components of the apparatus while only minimally draining its power source.

31 Claims, 6 Drawing Sheets

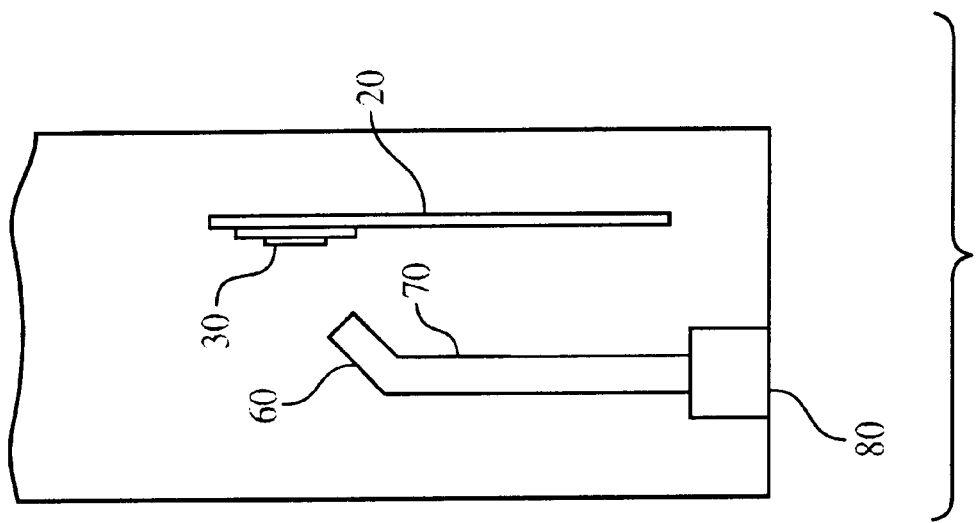
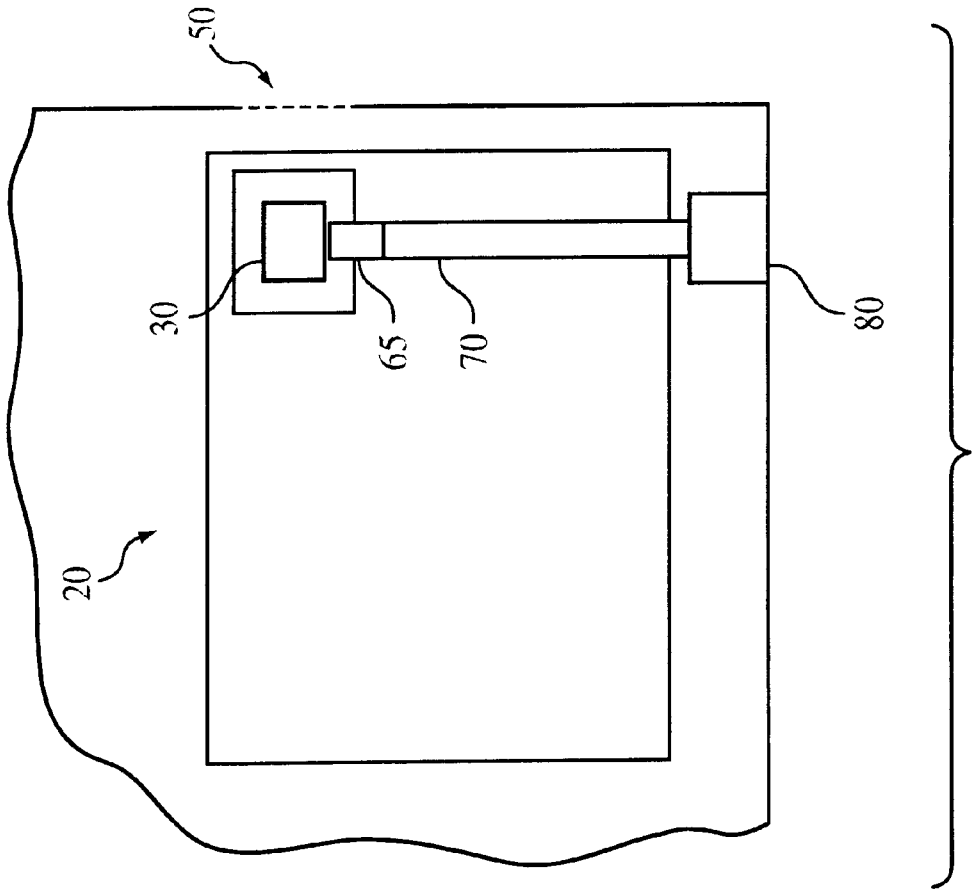

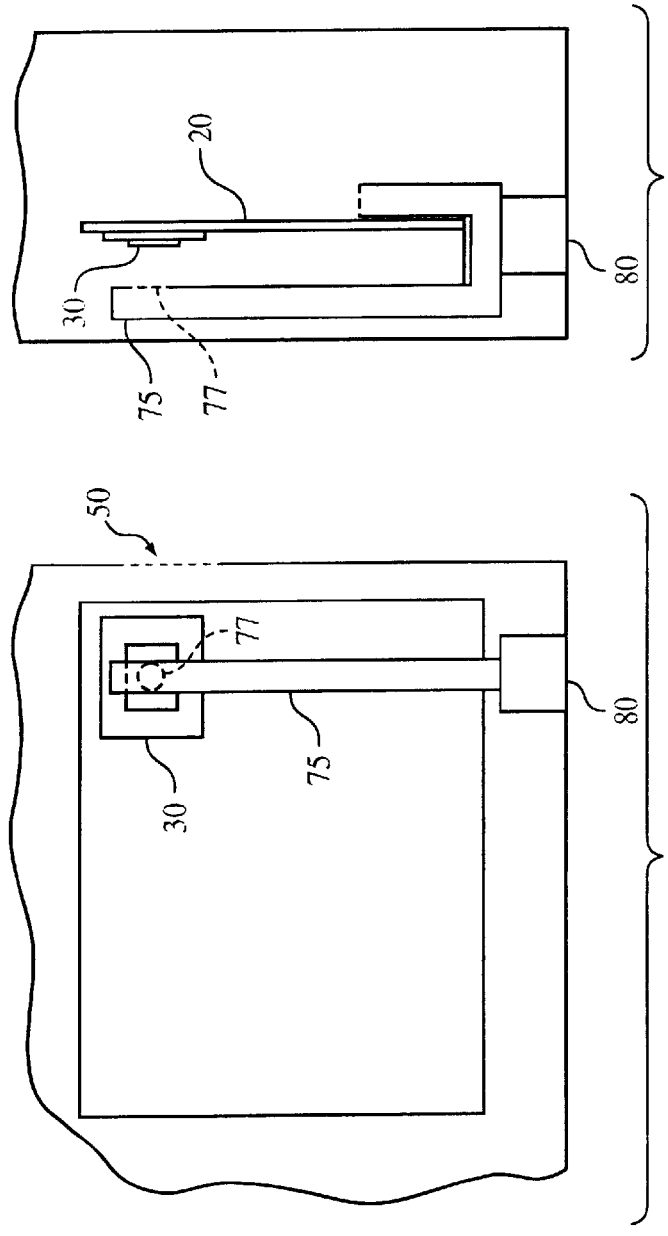
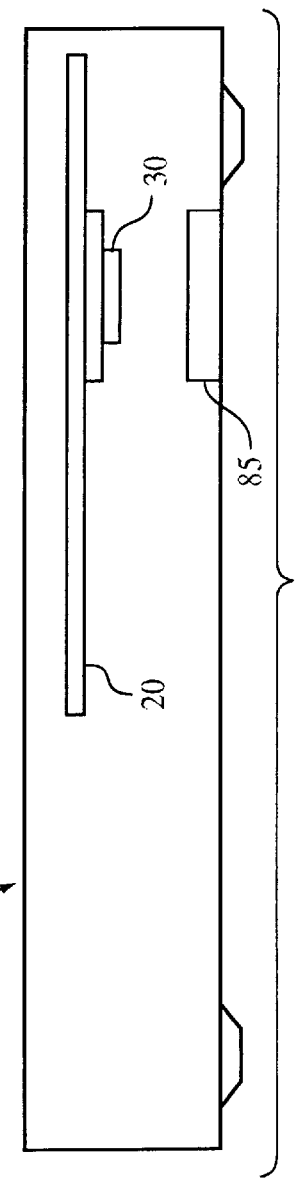

LAMINAR AIR JET COOLING OF HEAT PRODUCING COMPONENTS

BACKGROUND OF THE INVENTION

Managing heat dissipation of electronic components such as those in portable systems continues to be a challenge for engineers and designers. Portable computers pose a significant thermal management problem because of the need to increase their computational capabilities as well as their portability. Portable computers such as laptops or hand-held computers have higher power densities than desktop computers that use the same processor chips. Forced convection cooling schemes used in desktop computers are not generally applicable to portable computers because of space and battery power constraints.

SUMMARY OF THE INVENTION

The present invention relates to laminar jet cooling of heat producing components in an apparatus such as a portable computer. A low velocity, laminar jet of air is directly impinged on the surface of a heat producing component such as a microprocessor chip. A laminar jet flow has a very low mass flow rate and has a high convection heat transfer rate at the stagnation region of the flow. An air driving device such as a small energy efficient fan, an acoustic resonance device, or a small electromagnetically driven actuator assembly can be used to provide laminar jet air flow on the heat producing component. For any apparatus that places a premium on conserving power, delivering laminar jet air flow provides a way to dissipate heat while only minimally draining the power source of the apparatus.

In one embodiment of the invention, an apparatus for cooling heated bodies includes a heat producing component and an air driving device such as a fan, an acoustic resonance device or an electromagnetically driven actuator assembly, which produces a laminar jet of air having a Reynolds number below 2000, to cool the heat producing component. The laminar air flow preferably has a Reynolds number between 1500 and 60 and more preferably between 1500 and 500. The heat producing component can be a microprocessor.

The apparatus further includes a directing device such as a tubing for impinging the laminar air from the air driving device directly on the heat producing component.

In another embodiment of the invention, a laminar jet air cooling device includes a fan, an acoustic resonance device, or an electromagnetically driven actuator device for impinging a laminar jet of air directly on a heat producing electronic component mounted on a circuit board and a tubing coupled to the air driving device and having an outlet above the heat producing electronic component. The outlet directs the laminar jet of air on the heat producing electronic component at a predetermined angle, 90 degrees or less. The laminar air flow has a Reynolds number below 2000, preferably between about 1500 and 60, and more preferably between about 1500 and 500.

In another embodiment of the laminar jet air cooling device, the tubing bifurcates over and below the circuit board such that the tubing over the circuit board directs the laminar jet of air over the heat producing electronic component and the tubing under the circuit board forces the air away from the circuit board to dissipate additional heat.

The laminar jet air cooling device can further include a heat pipe mounted on the underside of the circuit board and connected to a keyboard of a portable system containing the circuit board for transferring heat from the circuit board to the keyboard.

In another embodiment of the invention, a portable computer system includes a circuit board containing a heat producing electronic component such as a microprocessor, and an air driving device such as a fan, an acoustic resonance device, or an electromagnetically driven actuator device for impinging a laminar jet of air directly on the heat producing electronic component.

The portable computer further has a tubing coupled to the air driving device and an outlet above the heat producing electronic component. The outlet directs the laminar jet of air on a surface of the heat producing electronic component at a predetermined angle, 90 degrees or less, over the heat producing electronic component.

In another embodiment of the portable computer system, a tubing bifurcates over and below the circuit board such that the tubing over the circuit board directs the laminar jet of air over the heat producing electronic component and the tubing under the circuit board forces the air out through a vent located close to the heat producing electronic component.

The portable computer system can further have a heat pipe mounted on the underside of the circuit board and connected to a keyboard for transferring heat from the circuit board to the keyboard.

The portable computer system can also have a card and a power supply positioned above the circuit board such that flowing air from the laminar jet of air carries heat away from the card and the power supply through the outlet vent.

In still another embodiment of the invention, a method of cooling a portable computer includes delivering a laminar jet of air to a heat producing electronic component mounted on a circuit board disposed within a portable computer. The laminar jet of air is directed over the heat producing electronic component at a predetermined angle over the heat producing electronic component.

A laminar jet of air can be directed on the heat producing electronic component from over the circuit board and also under the circuit board for letting the air escape through a vent disposed in the wall of the portable computer.

BRIEF DESCRIPTION OF THE DRAWINGS

FIG. 3A shows a top view of a portable computer with an angled tube outlet directed to a microprocessor according to another embodiment of the invention.

FIG. 3B shows a side view of FIG. 3A.

FIG. 4A shows a top view of a portable computer with a tubing extending over a circuit board and a branched tubing underneath the circuit board according to another embodiment of the invention.

FIG. 4B shows a side view of FIG. 4A.

FIG. 5 shows a microprocessor chip facing downward and a air driving device directly facing the chip from below in a portable computer according to another embodiment of the invention.

DETAILED DESCRIPTION OF THE INVENTION

The present invention relates to a method and apparatus for cooling a heat producing body by a laminar jet of air. The heat producing body can be an electronic component in an apparatus such as a laptop, a hand-held computer, or a mobile phone. The heat producing body could be a part of any system, requiring specific and selective cooling.

Figure 1B:
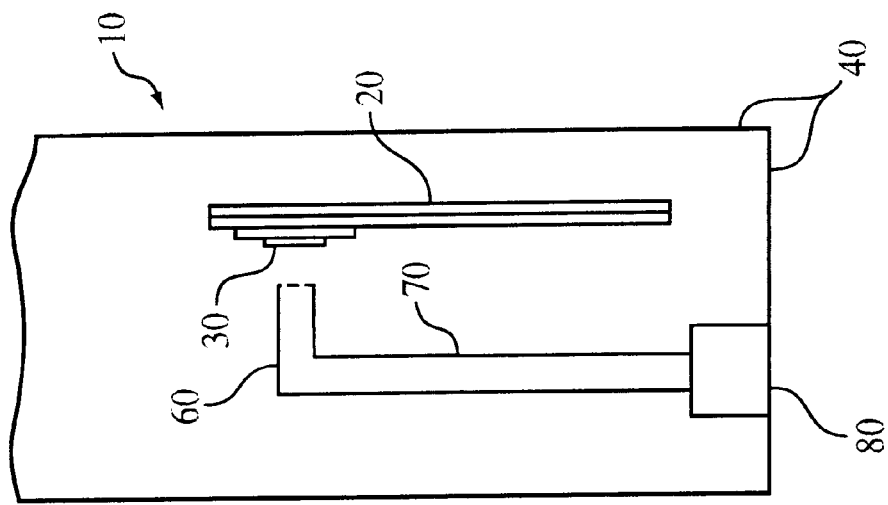
FIG. 1B shows a side view of FIG. 1A.
Figure 1A:
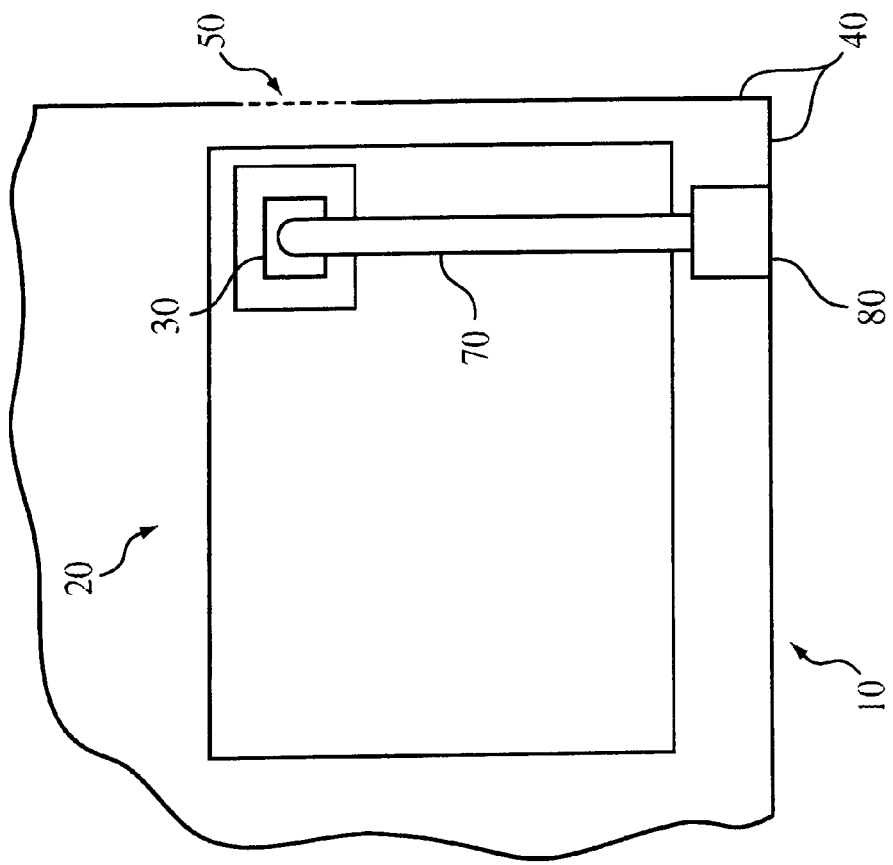
FIG. 1A shows a top view of a portable computer with a tubing providing a laminar jet of air over a microprocessor according to an embodiment of the invention.

Referring to FIGS. 1A and 1B, in one embodiment of the invention, a portable computer 10 includes a microprocessor chip 30 mounted on a circuit board 20. The chip 30 includes a substrate and a silicon die. A top cover with a keyboard and selected side walls of the computer 10 are omitted to better reveal the inner configuration. Other components of the portable computer 10 such as a power supply, a disk drive, a CD drive, and PCMCIA cards are also omitted in FIGS. 1A and 1B and later figures for clarity of presentation.

The circuit board 20 is surrounded by walls 40, one of which includes an outlet vent 50. A jet outlet 60 located directly above the microprocessor chip 30 is connected to a tubing 70 of appropriate diameter that leads to a fan 80, serving as an air driving device, located near or at the edge of one of the walls 40. The fan 80 can be a self-contained axial fan less than 25 mm in diameter to accommodate the compact internal spacing of the portable computer 10. Instead of the fan 80, other air driving devices may be used such as an acoustic resonance device or other electromagnetically driven actuators that produce the necessary laminar jet air flow.

The tubing 70 can be made of flexible or rigid plastic or other lightweight material in accordance with the particular structural requirements of the portable computer 10. For example, a fixed geometry conduit such as a molded plastic tubing can be designed and integrated into the portable computer 10.

In this embodiment, the tubing 70 is straight. However, it can be arranged to turn in a manner necessary to accommodate the design of the portable computer 10 so long as any bends or curves of the tubing do not significantly disrupt the laminar jet flow at the outlet.

Figure 2:
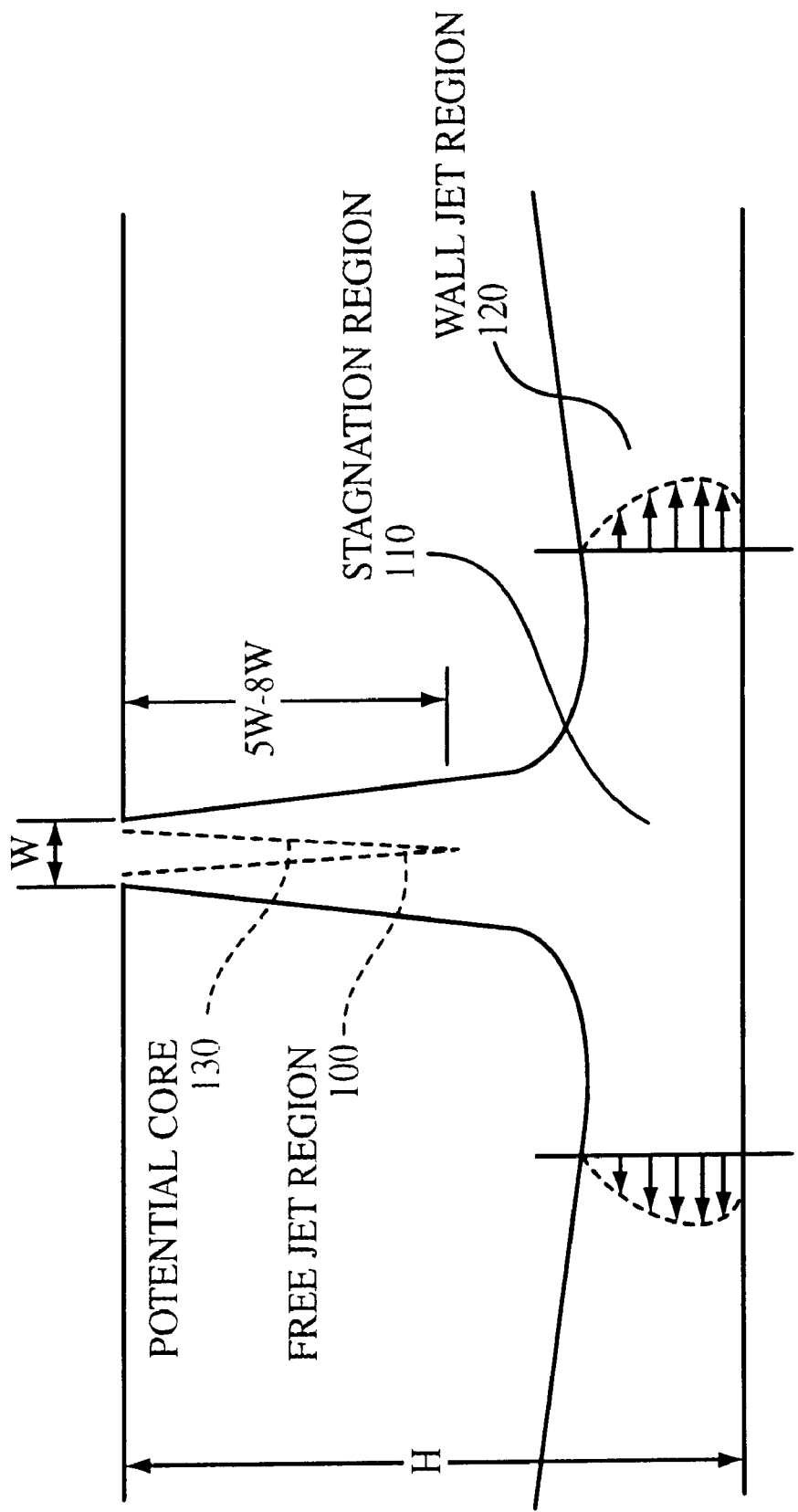
FIG. 2 shows a flow pattern of an impinging jet of air.

Referring to FIG. 2, a typical flow pattern of impinging jets of air can be subdivided into three regions: free jet region 100, stagnation flow region 110, and the wall jet region 120. The free jet region 100 includes a potential core 130. The length of the potential core 130 is generally 5–8 times the jet width. Much of the heat transfer from a heat producing component to the air occurs at the stagnation flow region 110. After impingement, the flow deflects in the transverse direction and begins to accelerate outwardly, creating a wall of jet flow in the wall jet region 120.

The Reynolds number is proportional to the average jet velocity times the diameter of the jet flow. To be in the laminar regime, the Reynolds number should be less than 2000, and preferably less than or equal to 1500. A jet with a Reynolds number of 1500 is expected to cool a processor chip with a heat load of approximately 10 Watts to a temperature of about 100° C. For a jet with the same Reynolds number, a processor with a heat load of approximately 5 Watts can be cooled to about 70° C. Furthermore, even a low laminar jet flow with a very low Reynolds number can still effectively cool heated components. For example, a jet with a Reynolds number of 63 is expected to cool a processor chip with a heat load of approximately 5 Watts to a temperature of about 90° C. Hence, a low laminar jet air with a Reynolds number less than 500 may be useful for cooling moderately powered components in portable systems, specifically, components with power dissipations that are just high enough to make cooling by natural convection unreliable.

The thermal characterization of the portable computer 10 is next considered in terms of (i) jet to chip spacing expressed as a ratio of height of the jet from the chip and width of the jet diameter (H/W), (ii) location and size of the vent, and (iii) cross-section of the jet flow.

In terms of the jet to chip spacing, moving the laminar jet closer to the chip 30 in the portable computer 10 is not expected to change the cooling performance significantly. Generally, H/W spacing of about 5.0 or less is desired for the potential core 130 of the laminar jet to reach the target for effective cooling. However, a portable computer can have a shallow compartment width of approximately 25 to 30 mm, which translates roughly into H/W spacing of about 2.5 or less with a given jet width of about 10 mm or less. Therefore, within the confines allowed by a thin portable computer, a laminar jet potential core of even a very low Reynolds number is expected to reach the target surface.

Changing the cross sectional area of the vent 50 is not expected to have much effect on the temperature of the chip 30. However, the location of the vent 50 is expected to have some significance on the chip temperature. It would be preferable to have the vent 50 located next to or as close as possible to the chip 30 so that the heated air can escape from the compartment rapidly. Furthermore, it would be preferable to have the vent 50 located at the side of the compartment rather than on the top surface of the compartment because a top surface vent is more likely to become inadvertently obstructed by the user. Furthermore, the top vent can be a target for spilled liquids or other foreign matter.

For a given Reynolds number, the cross-section of the jet flow, i.e. jet size, is expected to have some effect on the cooling of a processor. Larger jets result in cooler bulk air escaping the compartment because of the increased mass flow rate for a given Reynolds number. Smaller jets result in slightly cooler processor temperatures because of the increased heat transfer rate for a given Reynolds number. For example, for a given Reynolds number, a jet size smaller than the dimension of the microprocessor chip 30 would have a greater heat transfer rate that a jet size equal to the dimension of the microprocessor chip. The effect of jet size is expected to be more noticeable at higher Reynolds numbers, e.g. 1500 or greater, than at low Reynolds numbers, e.g. less than 500.

However, it is not the jet size but the Reynolds number that is the dominant thermal control parameter. A test was conducted to show the above concept. A conventional laptop was modified by removing its fan/heat sink assembly and positioning a round plastic tubing above the CPU through which low flow air was directed. The original fan/heat sink assembly had an airflow rate of $6.3 \times 10^{-4}$ m$^3$/s. Three jet diameters, 4.3 mm, 6.4 mm, and 9.5 mm were employed at the Reynolds numbers (Re) of 500, 1000, and 1500. This testing range yielded the volumetric flow rates summarized in Table 1.

TABLE 1

Volumetric Flow rates ($10^{-4}$ m$^3$/s)

|    |      | Jet Diameter | | |
|----|------|--------|--------|--------|
|    |      | 4.3 mm | 6.4 mm | 9.5 mm |
| Re | 500  | 0.19   | 0.28   | 0.35   |
|    | 1000 | 0.38   | 0.56   | 0.84   |
|    | 1500 | 0.76   | 0.84   | 1.25   |

The modified laptop was connected with Type T thermocouples to measure the CPU temperature. Steady state CPU surface temperatures above the ambient temperature are shown in Table 2.

TABLE 2

CPU Temperature (C. above ambient).

|    |      | Jet Diameter | | |
|----|------|--------|--------|--------|
|    |      | 4.3 mm | 6.4 mm | 9.5 mm |
| Re | 500  | 88 ± 4 | 83 ± 1 | 82 ± 2 |
|    | 1000 | 69 ± 1 | 72 ± 2 | 69 ± 2 |
|    | 1500 | 59 ± 3 | 62 ± 1 | 60 ± 1 |

The data in Table 2 indicate that Re, not the jet size, is the dominant thermal control parameter. The measured CPU temperatures for all jet diameters at the same Re are shown to be in agreement within experimental uncertainty. A jet with Re=1500 produced cooling similar to the original design with approximately one-eighth the volumetric flow rate. This would translate to a fan power consumption reduction of over 50% and a commensurate noise reduction.

In FIGS. 1A and 1B, the jet outlet 60 bends in a right angle from the tubing 70 to impinge a laminar jet of air on the surface of the chip 30. In other embodiment, the bend can be made with a smooth curve to further promote the laminar jet flow.

Referring to FIGS. 2A and 2B, in another embodiment of the invention, a jet outlet 65 is angled such that the laminar jet strikes the microprocessor chip 30 at an angle less than 90 degrees from the horizontal. This configuration can be suitable for a portable system with a very narrow compartmental width. The angle can be designed to provide the greatest amount of laminar flow within the structural constraint of the portable computer 10.

Referring to FIG. 4A and FIG. 4B is a side view of FIG. 4A, a tubing 75 extends over the microprocessor chip 30 from the fan 80. The tubing 75 has a hole 77 cut in the tubing at a position over the chip 30 to allow the laminar jet flow to directly impinge on the chip. The lack of a protruding outlet allows the configuration to be closer to the circuit board 20. The tubing 75 also has a second branched tubing extending underneath the circuit board 20 to push the air out to the outlet vent 50 for efficient heat dissipation.

Referring to FIG. 5, in another embodiment of the invention, the surface of the microprocessor chip 30 on the circuit board 20 faces down rather than up. This can be achieved either by configuring the circuit board 20 to attach the chip 30 at the underside of the circuit board 20 or by designing the portable computer 10 to have the circuit board 20 inverted. A very thin fan 85, can be positioned directly under the chip 30 and disposed on the bottom casing of the portable computer 10 to drive a laminar jet of air to the chip from below. In this configuration, a long tube is obviated.

Figure 6:
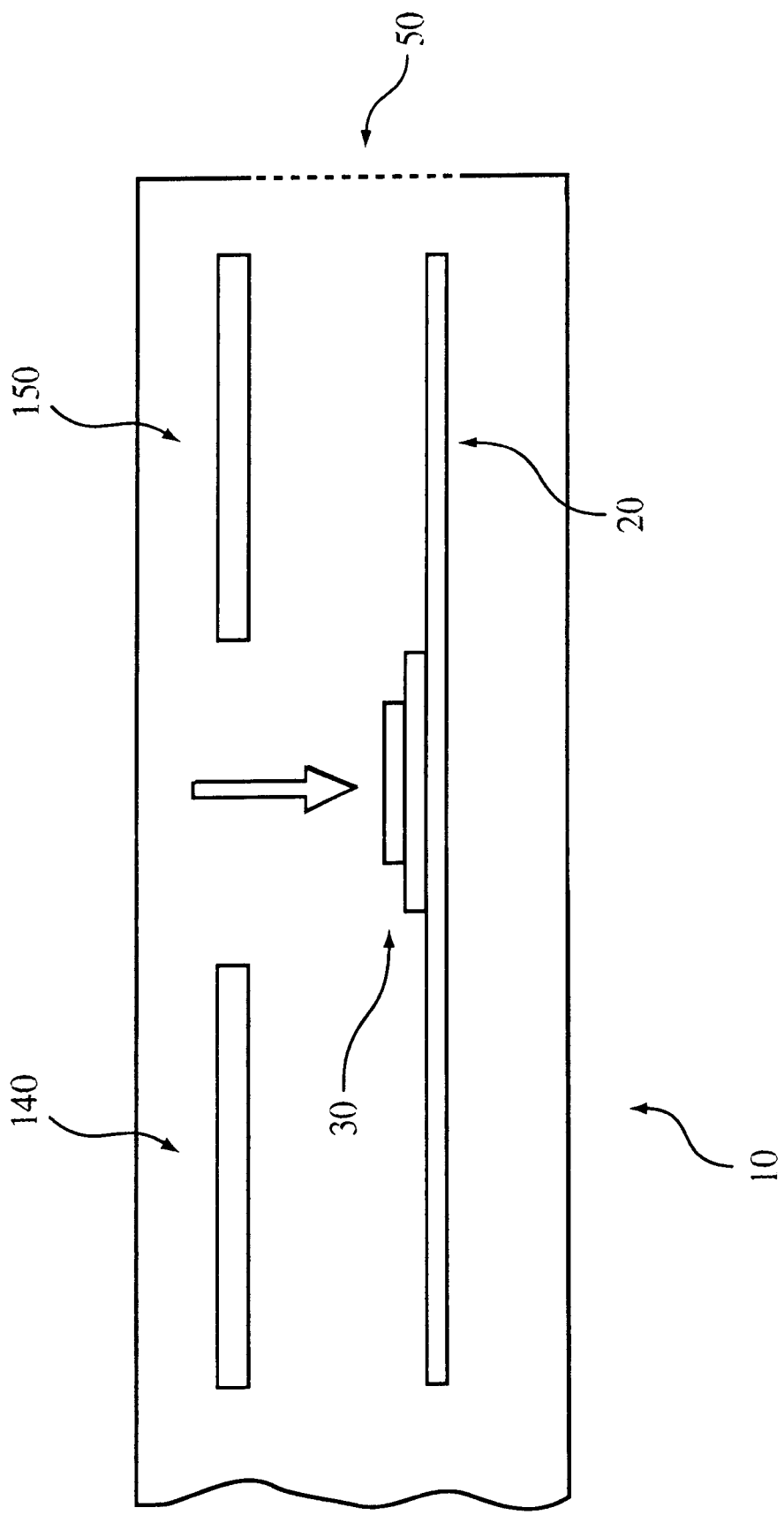
FIG. 6 shows a circuit board positioned below a power supply and a card according to another embodiment of the invention.

In an effort to further reduce the chip temperature, components such as PCMCIA cards and a power supply are located above a circuit board to reduce the thermal interaction of the circuit board with these heat producing bodies. For example, in another embodiment of the invention as shown in FIG. 6, the circuit board 20 is separated by about 10 to 20 mm in the vertical direction, relative to PCMCIA cards 140 and a power supply board 150. Care should be taken to configure the PCMCIA cards 140 and the power supply board 150 so that they do not interfere with the laminar flow to the chip 30. The laminar flow is indicated by a large arrow above the chip 30.

In this configuration, parasitic heating of the circuit board 20 is reduced. Furthermore, since the PCMCIA cards 140 and the power supply board 150 are located on the side of the laminar jet flow, where there is significant air velocity, heat from the PCMCIA cards, the power supply board and the circuit board is carried away from the compartment through the outlet vent 50. Thus, the thermal interaction between the various assemblies is decreased.

Figure 7:
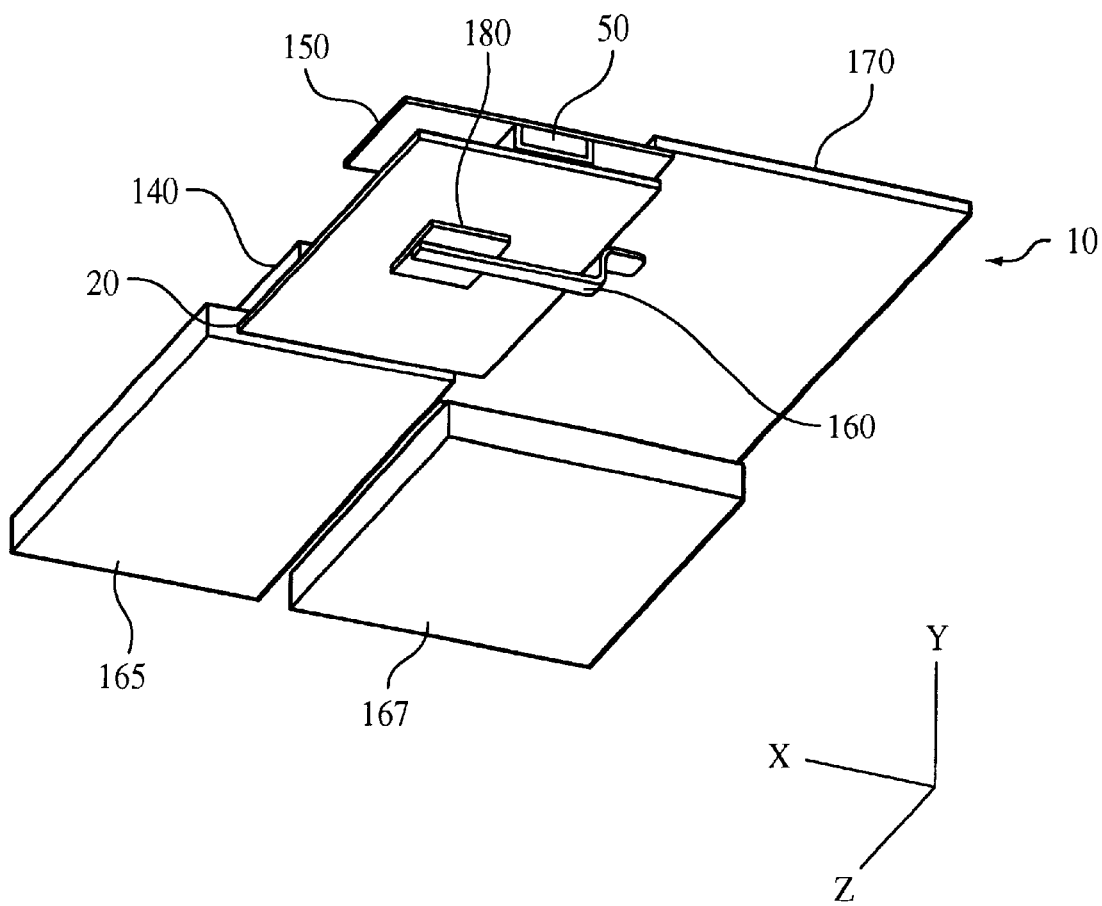
FIG. 7 shows a hybrid structure of a laminar jet cooling device and a heating pipe in a portable computer according to another embodiment of the invention.

In addition to providing a laminar jet over the microprocessor, in another embodiment of the invention as shown in FIG. 7, a miniature Copper-water heat pipe 160 can be mounted on the underside of the circuit board 20 to further contribute to the cooling of the microprocessor chip 30. The portable computer 10 without the walls 40 shows the power supply board 150 and the PCMCIA cards 140 both disposed above the circuit board 20, a battery 165 disposed beside the circuit board 20, and a disk drive 167 disposed beside the battery. The heat pipe 160 can provide a low resistance conduction path from the circuit board 20 to a keyboard 170, with the keyboard serving as a condenser for the heat pipe. The large surface area of the keyboard 170 can be used to spread the heat and provide a medium for heat dissipation by natural convection.

The heat pipe 160 interfaces the circuit board 20 with a 3.2 mm thick Copper mounting block 180. The mounting block 180 has the same in plane dimensions as the processor chip 30 and mounts directly below it, on the underside of the circuit board 20. The overall length of the heat pipe 160 can be 104 mm, and the cross section can be 2 mm×8 mm. The heat pipe 160 can be a solid conductive block with high thermal conductivity or a porous, annulus metal containing a saturated liquid in equilibrium with its own vapor. A thermally conductive adhesive may be used at the following interfaces: mounting block 180/circuit board 20, heat pipe 160/mounting block 180, heat pipe 160/keyboard 170. The thermal resistance due to the adhesive material is assumed to be about 0.5 cm$^2$C/W.

By dividing the heat between the laminar jet of air and the heat pipe 160, the combined cooling scheme can cool higher power systems. The laminar jet has a low mass flow rates with a high heat transfer rate, and consequently, provides near passive cooling for the circuit board 20 and the microprocessor chip 30. The heat pipe 160 can be used to efficiently transport heat from the circuit board 20 to the keyboard 170, effectively reducing the circuit board heat load by the amount of heat that conducts through the heat pipe. By using the large surface area of the keyboard 170 to dissipate heat by natural convection and radiation, active cooling at the condenser may be dispensed with.

The addition of the heat pipe 160 improves the overall thermal performance of the entire compartment by reducing the average board temperature and the average chip temperature. Transferring heat from the circuit board 20 to the keyboard 170 with the heat pipe 160 is expected to increase the average keyboard temperature. However, such temperature can be controlled to an acceptable level by selecting a heat pipe with appropriate heat conductivity.

A simulation of the laminar jet/heat pipe system suggests that a reduction of the thermal conductivity of the heat pipe 160 from 5000 W/mK to 1000 W/mK raises the chip temperature by only 3.5% since the thermal resistance of the heat pipe is low compared to heat dissipation by convention or radiation. Thus, even a heat pipe of very low conductivity coupled with laminar jet air cooling can effectively dissipate heat from the circuit board 20.

Although all of the embodiments of the invention are described in terms of the portable computer 10, the invention is applicable to any system that can be effectively cooled by laminar jet air.

Several embodiments of the invention have been described herein, but it should be understood that various additions and modifications could be made which fall within the scope of the following claims.

What is claimed is:

1. An apparatus comprising:
   a heat producing electronic component;
   an air driving device to produce a laminar jet of air having a Reynolds number below 2000; and
   a tube connected to the air driving device to direct the laminar jet of air directly on the heat producing electronic component.

2. The apparatus according to claim 1 wherein the laminar air flow has a Reynolds number between 1500 and 60.

3. The apparatus according to claim 1 wherein the laminar air flow has a Reynolds number between 1500 and 500.

4. The apparatus according to claim 1 wherein the air driving device comprises a fan.

5. The apparatus according to claim 1 wherein the apparatus is a portable computer.

6. The apparatus according to claim 1 wherein the heat producing component comprises a microprocessor.

7. The apparatus according to claim 1 wherein the tube has an outlet above the heat producing component to direct the laminar air down to the heat producing component.

8. A laminar jet air cooling device comprising:
   a fan; and
   a tubing coupled to the fan and having an outlet above a heat producing electronic component on a circuit board to impinge a laminar jet of air directly on the heat producing electronic component,
   wherein the laminar jet of air has a Reynolds number below about 2000.

9. The device according to claim 8 wherein the outlet directs the laminar jet of air vertically on the heat producing electronic component.

10. The device according to claim 8 wherein the outlet directs the laminar jet of air at a predetermined angle over the heat producing electronic component.

11. The device according to claim 8 wherein the tubing bifurcates over and below the circuit board such that the tubing over the circuit board directs the laminar jet of air over the heat producing electronic component and the tubing under the circuit board forces the air away from the circuit board to dissipate additional heat.

12. The device according to claim 8 wherein the laminar jet of air has a Reynolds number between about 60 to about 1500.

13. The device according to claim 8 wherein the laminar jet of air has a Reynolds number between about 500 and about 1500.

14. The device according to claim 8 further comprising:
   a heat pipe mounted on the underside of the circuit board and connected to a keyboard of a portable system containing the circuit board for transferring heat from the circuit board to the keyboard.

15. A portable computer system comprising:
   a circuit board containing a heat producing electronic component; and
   an air driving device for providing a laminar jet of air; and
   a tubing coupled to the air driving device for impinging a laminar jet of air directly on the heat producing electronic component,
   wherein the laminar jet of air has a Reynolds number below about 2000.

16. The portable computer system according to claim 15 wherein the tubing has an outlet above the heat producing electronic component to direct the laminar air on the heat producing electronic component.

17. The portable computer system according to claim 15 wherein the laminar jet of air has a Reynolds number between about 60 to about 1500.

18. The portable computer system according to claim 15 wherein the laminar jet of air has a Reynolds number between about 500 and about 1500.

19. The portable computer system according to claim 15 further comprising:
   a keyboard;
   a heat pipe mounted on the underside of the circuit board and connected to the keyboard for transferring heat from the circuit board to the keyboard.

20. The portable computer system according to claim 15 wherein the heat producing electronic component comprises a microprocessor.

21. The portable computer system according to claim 15 wherein the air driving device comprises a fan.

22. The portable computer system according to claim 15 further comprising:
   a card; and
   a power supply;
   wherein the card and the power supply are positioned above the circuit board such that flowing air from the laminar jet of air carries heat away from the card and the power supply through the vent.

23. The portable computer system according to claim 16 wherein the outlet directs the laminar jet of air vertically on a surface of the heat producing electronic component.

24. The portable computer system according to claim 16 wherein the outlet directs the laminar jet of air at a predetermined angle over the heat producing electronic component.

25. The portable computer system according to claim 16 wherein the tubing bifurcates over and below the circuit board such that the tubing over the circuit board directs the laminar jet of air over the heat producing electronic component and the tubing under the circuit board forces the air out through a vent located close to the heat producing electronic component.

26. A method of cooling a portable computer comprising:
   delivering a laminar jet of air to a heat producing electronic component mounted on a circuit board disposed within a portable computer by driving the laminar jet of air from an air driving device through a tube that is connected to the air driving device, wherein the laminar jet of air has a Reynolds number below about 2000.

27. The method according to claim 26 further comprising:

directing the laminar jet of air vertically down on the heat producing electronic component.

28. The method according to claim 26 further comprising:

directing the laminar jet of air at a predetermined angle over the heat producing electronic component.

29. The method according to claim 26 further comprising:

directing the laminar jet of air on the heat producing electronic component from over the circuit board; and directing the laminar jet of air under the circuit board for letting the air escape through a vent on the portable computer.

30. The method according to claim 26 wherein the laminar jet of air has a Reynolds number between about 60 to about 1500.

31. The method according to claim 26 wherein the laminar jet of air has a Reynolds number between about 500 and about 1500.

* * * * *